United States Patent
Mangia et al.

(10) Patent No.: US 9,341,692 B2
(45) Date of Patent: May 17, 2016

(54) MAGNETIZATION TRANSFER AND OFF-RESONANCE PROTOCOLS IN NMR

(75) Inventors: Silvia Mangia, Minneapolis, MN (US);
Shalom Michaeli, St. Paul, MN (US);
Michael G. Garwood, Medina, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 738 days.

(21) Appl. No.: 13/641,440

(22) PCT Filed: Apr. 14, 2011

(86) PCT No.: PCT/US2011/032485
§ 371 (c)(1),
(2), (4) Date: Nov. 28, 2012

(87) PCT Pub. No.: WO2011/130508
PCT Pub. Date: Oct. 20, 2011

(65) Prior Publication Data
US 2013/0069649 A1    Mar. 21, 2013

Related U.S. Application Data

(60) Provisional application No. 61/324,595, filed on Apr. 15, 2010.

(51) Int. Cl.
*G01V 3/00* (2006.01)
*G01R 33/56* (2006.01)

(52) U.S. Cl.
CPC ............ *G01R 33/56* (2013.01); *G01R 33/5605* (2013.01)

(58) Field of Classification Search
CPC ...................................................... G01R 33/56
USPC ......................................................... 324/309
See application file for complete search history.

(56) References Cited

U.S. PATENT DOCUMENTS

| | | | | |
|---|---|---|---|---|
| 4,593,247 A | * | 6/1986 | Glover | G01R 33/5604 324/307 |
| 5,200,699 A | * | 4/1993 | Baldwin | G01V 3/32 324/303 |
| 5,245,282 A | * | 9/1993 | Mugler, III | G01R 33/4835 324/309 |

(Continued)

FOREIGN PATENT DOCUMENTS

WO    WO-2011130508 A1    10/2011

OTHER PUBLICATIONS

International Application Serial No. PCT/US2011/032485, International Preliminary Report on Patentability mailed Oct. 26, 2012, 12 pgs.

(Continued)

*Primary Examiner* — Benjamin M Baldridge
(74) *Attorney, Agent, or Firm* — Schwegman Lundberg & Woessner, P.A.

(57) ABSTRACT

A method includes acquiring a signal intensity from a spin system after applying the radio frequency preparation pulses prior to the imaging readout or spectroscopic localization, and acquiring signal intensity starting with magnetization initially rotated to a certain angle by applying an initial pulse before the preparation scheme, and processing the data to generate an image or spectra corresponding to the spin system. The imaging or spectroscopy sequence is configured to provide data based on magnetization transfer or an off-resonance effect.

13 Claims, 4 Drawing Sheets

(56) References Cited

U.S. PATENT DOCUMENTS

| | | | | |
|---|---|---|---|---|
| 5,285,158 | A | * | 2/1994 | Mistretta .............. G01R 33/563 324/306 |
| 6,291,994 | B1 | * | 9/2001 | Kim ..................... G01R 33/441 324/300 |
| 2005/0228210 | A1 | * | 10/2005 | Muntermann ........... A61N 2/02 600/14 |
| 2006/0066309 | A1 | * | 3/2006 | Arik ................... G01R 33/3856 324/318 |
| 2008/0278159 | A1 | * | 11/2008 | Park ................... G01R 33/5615 324/307 |
| 2009/0302838 | A1 | * | 12/2009 | Haas .................... G01R 33/483 324/307 |
| 2010/0060278 | A1 | * | 3/2010 | Park ................... G01R 33/4828 324/309 |
| 2010/0142784 | A1 | * | 6/2010 | Yarnykh ............ G01R 33/4608 382/131 |
| 2010/0264920 | A1 | * | 10/2010 | Witschey ........... G01R 33/5614 324/309 |
| 2011/0092797 | A1 | * | 4/2011 | Wang ..................... G01R 33/56 600/410 |
| 2011/0206260 | A1 | * | 8/2011 | Bergmans ............. G01R 33/54 382/131 |
| 2011/0241670 | A1 | * | 10/2011 | Lai ..................... G01R 33/5611 324/309 |

OTHER PUBLICATIONS

Abergel, D., et al., "On the Use of Stochastic Liouville Equation in Nuclear Magnetic Resonance: Application to $R_{1\rho}$ Relaxation in the Presence of Exchange", *Concepts Magn.Reson. A*, 19A(2), (2003), 134-148.

Balaban, R. S., et al., "Magnetization transfer contrast in magnetic resonance imaging", *Magnetic Resonance Quarterly*, 8(2), (1992), 116-137.

Garwood, M., et al., "Advances in Magnetic Resonance", *Journal of Magnetic Resonance*, 153(2), (2001), 155-177.

Mangia, S., et al., "Rotating frame relaxation during adiabatic pulses versus conventional spin-lock: simulations and experimental results at 4T", *NIH Public Access, Author Manuscript, published in final form in Magn. Reson. Imaging*, 27(8), (2009), 1074-1087.

Michaeli, S., et al., "$T_{2\rho}$ and $T_{1\rho}$ Adiabatic Relaxations and Contrasts", *Curr. Anal. Chem.*, 4(1), (2008), 8-25.

Michaeli, S., et al., "$T_{1\rho}$ MRI contrast in the human brain: Modulation of the longitudinal rotating frame relaxation shutter-speed during an adiabatic RF pulse", *Journal of Magnetic Resonance*, 181, (2006), 135-147.

Yarnykh, V. L., "Pulsed Z-Spectroscopic Imaging of Cross-Relaxation Parameters in Tissues for Human MRI: Theory and Clinical Applications", *Magn. Reson. Med.*, 47, (2002), 929-939.

International Application Serial No. PCT/US2011/032485, International Search Report mailed Aug. 18, 2011, 3 pgs.

International Application Serial No. PCT/US2011/032485, Written Opinion mailed Aug. 18, 2011, 12 pgs.

Eng, John, et al., "Quantitative 'H Magnetization Transfer Imaging in Vivo", Magnetic Resonance in Medicine 17, (1991), 304-314.

Hajnal, Joseph V, et al., "Design and Implementation of Magnetized Transfer Pulse Sequences for Clinical Use", Journal of Computer Assisted Tomography vol. 16 (1), (Jan. 1992), 7-18.

Prantner, Andrew M, et al., "Magnetization Transfer Induced Biexponential Longitudinal Relaxation", Magnetic Resonance in Medicine 60, (2008), 555-563.

Vinogradov, E., et al., "PCEST: Positive Contrast using Chemical Exchange Saturation Transfer", Proc. Intl. Soc. Mag. Reson. Med. 17, (2009), 1 pg.

* cited by examiner

MAGNETIZATION TRANSFER AND OFF-RESONANCE PROTOCOLS IN NMR

CLAIM OF PRIORITY

This patent application is a nationalization under 35 U.S.C. 371 of PCT/US2011/032485, filed 14 Apr. 2011 and published as WO 2011/130508 on 20 Oct. 2011, which claims the benefit of priority, under 35 U.S.C. Section 119(e), to Silvia Mangia et al., U.S. Provisional Patent Application Ser. No. 61/324,595, entitled "MAGNETIZATION TRANSFER AND OFF-RESONANCE PROTOCOLS IN NMR," filed on Apr. 15, 2010, which are hereby incorporated by reference herein in their entirety.

STATEMENT REGARDING FEDERALLY SPONSORED RESEARCH OR DEVELOPMENT

This invention was made with government support under award numbers BTRR-P41 RR008079, P30 NS057091, R01NS061866, and R21NS059813, from the National Institutes of Health. The government has certain rights in this invention.

BACKGROUND

Magnetization transfer imaging is based on the exchange of magnetization in biologic tissues between a pool of protons in water and a pool of protons that is bound to macromolecules. The magnitude of the effect depends, in part, on the ratio of water and macromolecules. Magnetization exchange processes can involve a pool of protons characterized by different chemical shifts.

In the brain, macromolecules that contribute to the magnetization transfer effect include the cholesterol component of myelin, cerebrosides, and phospholipids.

Currently available protocols for magnetization transfer (MT) imaging and off-resonance experiments (such as off-resonance rotating frame $T_{1\rho}$ or Z-spectroscopy) are inadequate. For example, estimation of magnetization transfer (MT) parameters in vivo can be compromised by an inability to drive the magnetization to a steady state using allowable levels of radio frequency (RF) irradiation, due to safety concerns (tissue heating and specific absorption rate (SAR)).

OVERVIEW

A method includes applying an initial pulse to a spin system, applying an imaging sequence or spectroscopy sequence following the initial pulse, and processing the data to generate an image corresponding to the spin system. The imaging sequence or spectroscopy sequence is configured to provide data based on magnetization transfer or generally on off-resonance experiments. The initial pulse includes a radio frequency perturbation which induces a rotation of magnetization to a certain angle. In one example, the angle is 180°. Other magnetization rotation angles are also contemplated including those less than 180° and those greater than 180°. Rather than using the initial pulse for saturating a coupled partner of the exchanging system, as in traditional MT imaging, an example of the present subject matter employs the initial pulse for purposes of preparing the unsaturated partner which is thereafter imaged using a readout module.

Rather than increasing the RF duration or amplitude, the SAR limitation can be overcome by sampling the formation of the steady state in separate measurements made with the magnetization initially along the −z and +z axis of the laboratory frame, i.e. with or without an on-resonance inversion pulse prior to the off-resonance irradiation. This can be beneficial in the fitting procedure used to estimate MT parameters from, for example, human brain imaging. The resulting parametric maps can exhibit increased tissue specificity as compared to those obtained with standard MT acquisition in which magnetization is initially along the +z axis only.

These examples can be combined in any permutation or combination. This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views Like numerals having different letter suffixes may represent different instances of similar components. The drawings illustrate generally, by way of example, but not by way of limitation, various embodiments discussed in the present document.

DETAILED DESCRIPTION

Part 1 includes a description of magnetic resonance imaging and a system according to one example. Part 2 includes a description of an experiment and Part 3 includes a description including a discussion of a method.

Part 1

Figure 1:
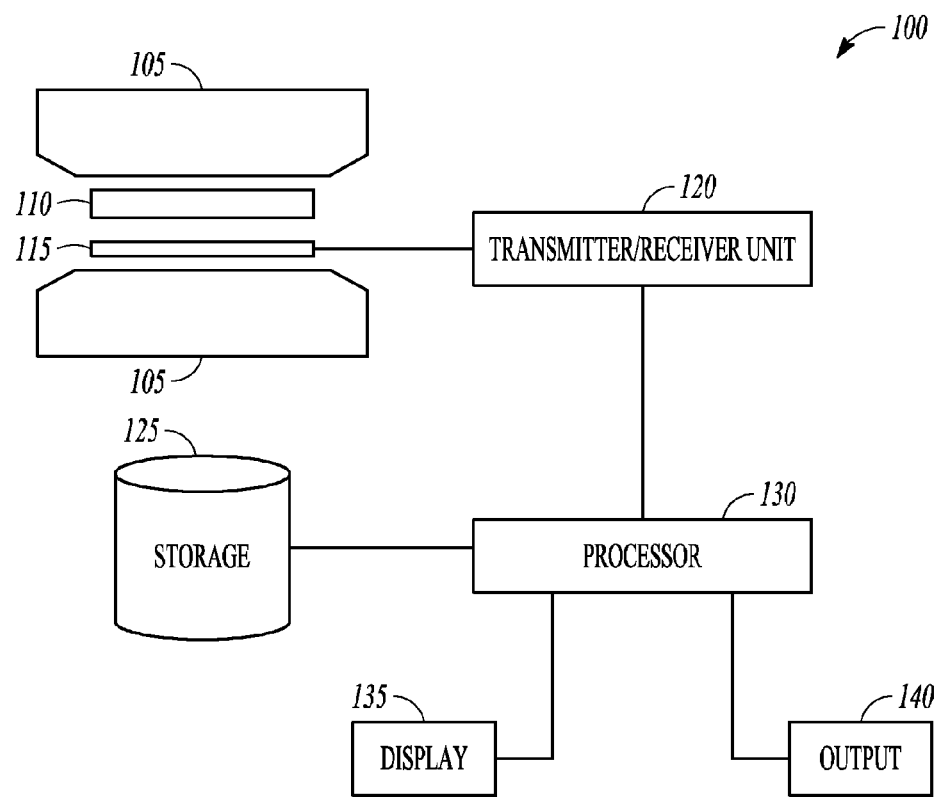
FIG. 1 illustrates a magnetic resonance system according to one example.

FIG. 1 includes a block diagram of magnetic resonance system 100. Magnetic resonance system 100, in one example, depicts an imaging system 100 having magnet 105. In one example, system 100 includes a nuclear magnetic resonance (NMR) system. Magnet 105 can provide a magnetic field. Coil 115 and subject 110 are positioned within the field of magnet 105. Subject 110 can include a human body, an animal, a phantom, a specimen, or other spin system. Coil 115, sometimes referred to as an antenna, can include a transmit coil, a receive coil, a separate transmit coil and receive coil, or a transceiver coil. Coil 115 is in communication with transmitter/receiver unit 120 and with processor 130. In various examples, coil 115 both transmits and receives radio frequency (RF) signals relative to subject 110. Transmitter/receiver unit 120 can include a transmit/receive switch, an analog-to-digital converter (ADC), a digital-to-analog converter (DAC), an amplifier, a filter, or other modules configured to excite coil 115 and to receive a signal from coil 115. Transmitter/receiver unit 120 is coupled to processor 130. Coil 115 and transmitter/receiver unit 120 can be referred to as a driver unit.

Processor 130 can include a digital signal processor, a microprocessor, a controller, or other module. Processor 130, in one example, is configured to generate an excitation signal (for example, a pulse sequence) for coil 115. Processor 130, in one example, is configured to perform a post-processing operation on the signal received from coil 115. Processor 130 is also coupled to storage 125, display 135 and output unit 140.

Storage 125 can include a memory for storing data. The data can include image data as well as results of processing performed by processor 130. In one example, storage 125 provides storage for executable instructions for use by processor 130. The instructions can be configured to generate and deliver a particular pulse sequence or to implement a particular algorithm.

Display 135 can include a screen, a monitor, or other device to render a visible image corresponding to subject 110. For example, display 135 can be configured to display a radial projection, a Cartesian coordinate projection, or other view corresponding to subject 110. Output unit 140 can include a printer, a storage device, a network interface or other device configured to receive processed data.

The present subject matter can be implemented using system 100 or other system suitable for nuclear magnetic resonance, magnetic resonance imaging, ferromagnetic resonance (FMR), or ferromagnetic spin wave resonance (FSWR).

Part 2

Magnetization transfer and off-resonance experiments are associated with certain shortcomings. For example, they often require long RF irradiation which may lead to high specific absorption rate (SAR). In addition, a ratio measurement of MT may not be sufficiently specific.

An example of the present subject matter can be applied to produce improved contrast using magnetization transfer and off-resonance $T_{1\rho}$ and chemical exchange saturation transfer (CEST).

Examples of the present subject matter include methods and systems for conducting magnetic resonance imaging using magnetization transfer.

In one example, the off-resonance pulse which perturbs the spin system is combined with an initial pulse. The initial pulse may include an inversion. The initial pulse can be applied prior to the MT imaging sequence. As such, the dynamic range of the signal can be improved without a significant increase in specific absorption ratio (SAR). In one example, an off-resonance pulse is combined with an initial pulse which rotates magnetization (M) to a selected angle.

Figure 2A:
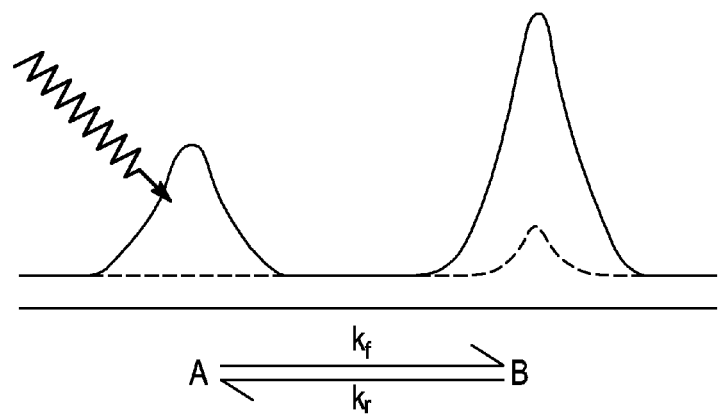
FIG. 2A illustrates pulses associated with magnetization transfer according to one example.
Figure 2B:
FIG. 2B illustrates an initial pulse, off-resonance irradiation, and readout scheme for magnetization transfer according to one example.
Figure 2C:
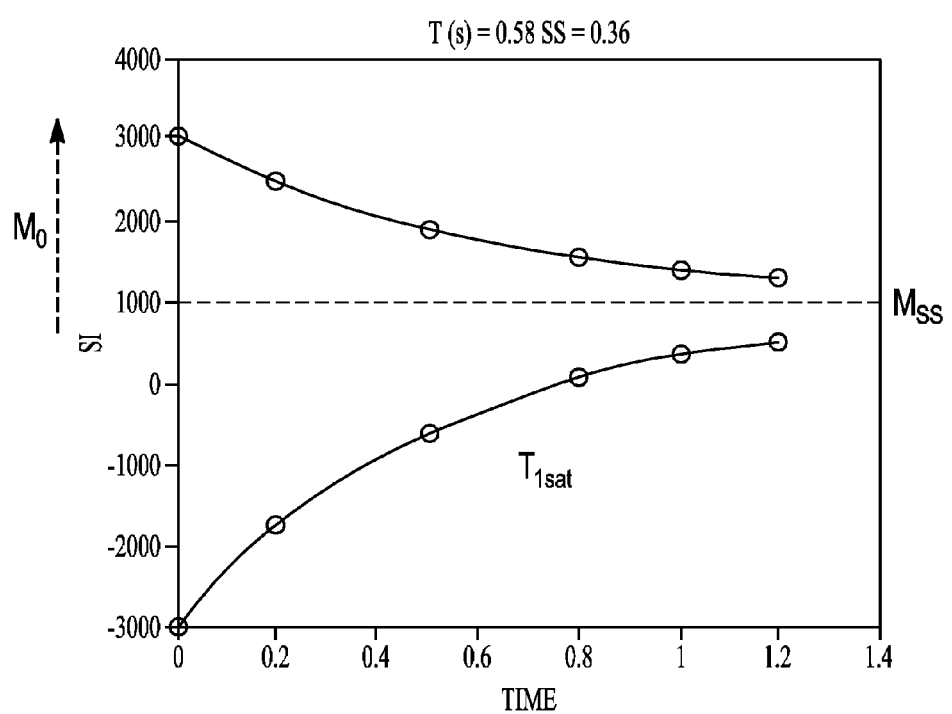
FIG. 2C illustrates a plot of discrete data points associated with magnetization transfer according to one example.

FIG. 2A illustrates magnetic transfer as between pool A and pool B and in the figure, $k_f$ denotes a forward exchange rate and $k_r$ denotes a reverse exchange rate. Pool A can be saturated, for example, by a pulse which is 6 kHz however, other values are also contemplated. FIG. 2B illustrates application of an initial pulse (here denoted as a 180° pulse) proceeding continuous wave off-resonance irradiation (here denoted as MT pulse) and readout (here Spin Echo Imaging readout). The 180° pulse is shown in dotted lines which denote that the pulse can be selectively turned on or turned off. In this example, the 180° pulse initially aligns M in the negative z direction (−z). FIG. 2C graphically illustrates the relationship between $M_0$, $T_{1sat}$, and $M_{SS}$. The rate of change in both the upper curve and in the lower curve is $T_{1sat}$. The curves, with increasing time, approach a steady state magnetization value $M_{SS}$, and in this example, that value is 1000.

The present subject matter includes a protocol and analytical procedure to generate parametric maps that characterize water dynamics for in vivo tissue.

Applications can include imaging and spectroscopy tailored for analysis of a human brain or body. In addition, the present subject matter can be used for analysis of neurological disorders (such as multiple sclerosis, Parkinson's disease), cancer, and stroke. According to one example, the imaging sequence can be applied to analyze demyelination and remyelination. Examples of an imaging sequence include a pulse train configured for at least one of magnetization transfer (MT), chemical exchange saturation transfer (CEST), spin-lock $T_{1\rho}$ (SL-$T_{1\rho}$), or relaxation along a fictitious field (RAFF).

An imaging sequence can include using two consecutive acquisitions wherein magnetization is initially aligned with the positive and then negative longitudinal axis z of a magnetic resonance system.

An example of the present subject matter can be implemented for purposes of mapping isochronous exchange (e.g., exchange between spins with identical chemical shifts) in the human brain using different radio frequency (RF) pulse preparation schemes.

Introduction

Water relaxation in brain tissue in vivo is largely affected by exchange phenomena between protons with identical chemical shifts and with different relaxation rate constants not related to exchange (isochronous exchange, IE). The IE of bulk water protons with the protons contained in the macromolecules generates the magnetization transfer (MT) effect when the "solid" pool is saturated by placing a continuous-wave (CW) radio frequency (RF) pulse several kHz off-resonance from water.

By progressively incrementing the duration of the off-resonance pulse, the $T_1$ of water in the presence of saturation ($T_{1sat}$) and the steady state (SS) magnetization ($M_{ss}$) can be estimated, and the forward exchange rate from the solid to the free pool, $k_f$, can be calculated as $(1-M_{ss}/M_0)/T_{1sat}$.

This expression for $k_f$ is valid when complete saturation of the solid pool is achieved, and in the absence of off-resonance artifacts. An analytical description of the two-pool model (or more than two pools of exchanging spins) can be used to provide a quantitative description of the MT effect in the case of incomplete saturation and in the presence of off-resonance artifacts. The MT effect is an MR imaging modality that can be used for clinical applications. The interaction of bulk water protons with the protons contained in the macromolecules can provide information about tissue integrity.

The detection of the MT effect in clinical practice is usually limited to the measurement of a qualitative MT ratio (MTR), which is the result of the combination of several fundamental quantities, and is dependent on the acquisition parameters. Likely due to this limitation, controversial results about MTR differences have been reported, for instance in the brains of schizophrenic patients as compared to control subjects. In multiple sclerosis, weak correlations of MTR with disability parameters have also been found. On the other hand, the acquisition and processing MT protocols for obtaining quantitative MT parametric maps, which are based on the two-site exchange model, are generally not straightforward in clinical MRI practice, and provide parametric maps with limited tissue contrast and specificity.

A source of instability in the fitting procedure of $T_{1sat}$ and $M_{ss}$ originates from using MT pulses that are too short to achieve the steady state, due to safety limitations imposed by the specific absorption rate (SAR) of RF power deposition.

The present subject matter sets forth a solution to this problem. One example includes a protocol for the acquisition of MT in vivo. The method uses CW MT measurements in which two consecutive sets of measurements are acquired with the magnetization initially along the −z or +z axis, i.e. with or without an on-resonance inversion prior to the off-resonance irradiation as shown in FIG. 2B.

FIG. 2B illustrates a pulse sequence for the MT protocol. The frequency of the MT pulse is 6 kHz off-resonance, and the peak amplitude ($\gamma B_1/2\pi$) is 150 Hz for human studies. The dashed squares indicate incremental durations of the MT pulse, which is applied immediately prior to the excitation pulse of the imaging module. The MT measurement is performed twice, with and without an on-resonance inversion pulse prior to the off-resonance irradiation, with no time delay. The time between the inversion pulse and the excitation pulse of the imaging module is determined by the duration of the MT pulse, thus leading to inversion recovery that occurs entirely in presence of the off-resonance irradiation. In this study, the imaging module consisted of a fast SE readout with 90° excitation, while the MT pulse consisted of CW irradiation. However, other types of imaging readout are possible, as well as other pulsed approaches can be implemented instead of CW irradiation to achieve the off-resonance saturation.

In one example, an on-resonance inversion pulse is used prior to the off-resonance irradiation.

Methods

Five subjects can be investigated a 90-cm-bore 4 T magnet (OMT, Inc., Oxon, UK) with Varian UNITYINOVA console (Varian Inc., Palo Alto, Calif.). Images can be acquired using fast spin echo readout, TR=9-10 s (depending on the coil loading), number of echoes=16, TE=0.073 s, matrix 256×256, FOV=25.6 cm×25.6 cm, and slice-thickness=4 mm. Magnetization transfer can be conducted using a 6 kHz off-resonance CW-pulse with incremental duration (0.2, 0.5, 0.8, 1.0, 1.2 s) or (0.0, 0.3, 0.6, 0.9, 1.2 s) and $\omega_1^{max}/(2\pi)$=0.15 kHz, applied prior to the imaging readout. Separate measurements can be performed with the magnetization initially along the +z or −z axis, i.e. without or with initial global inversion that can be achieved by an adiabatic full passage pulse of the hyperbolic secant family (pulse length=6 ms, $\omega_1^{max}/(2\pi)$=1.2 kHz, bandwidth ~3.3 kHz).

With these parameters, the duration of the MT protocol can be ~25 min. First order shim terms can be manually adjusted using the global, unlocalized water signal, typically reaching a water line-width ~20-30 Hz. Data can be collected from an axial (transverse) section at the level of the corpus callosum, for good visualization of grey and white matter structures. The RF power delivered to the coil can be limited to a safe operating range using the hardware monitoring module of the Varian console. In addition, the RF power output over the full range of settings can be measured with an oscilloscope connected to the coil port. From these measured values, the average RF power delivered to the coil can be computed by integration of all RF pulses in the sequence, and SAR can be estimated assuming a tissue load of 3 kg in the volume coil. When using the longest pulse, the estimated SAR may be below 3 W/kg averaged over the head for 10 min.

Estimation of MT Parameters

The parameters $T_{1sat}$ and $M_{ss}$ can be calculated on a pixel-by-pixel basis from the time-course of signal intensity (SI) using a non-linear regression algorithm with the following functions:

$$SI(t) = M_0 e^{-t/T_{1sat}} + M_{ss}(1-e^{-t/T_{1sat}}) \quad (1)$$

$$SI(t) = -M_0 e^{-t/T_{1sat}} + M_{ss}(1-e^{-t/T_{1sat}}) \quad (2)$$

where $M_0$ is the fully relaxed magnetization in the absence of RF, and t is duration of the CW pulse. Eq. (1) and Eq. (2) apply when magnetization is initially placed in the positive or negative hemispheres of the laboratory frame, respectively. Note that the in vivo system is generally characterized by multiple pools of protons (for instance, characterizing white and grey matter), which could invalidate the description based on mono-exponential functions provided by Eqs. 1 and 2. However, the mono-exponential approximation may be a reasonable choice for parametric maps which are generated on a pixel-by-pixel basis. In addition, the presence of the on-resonance inversion pulse prior to the CW irradiation may modify the conditions of saturation of the solid pool as compared to the case of Eq. 1, especially at short saturation times.

If the effect of the inversion pulse is inconsequential as compared to the effect of the subsequent off-resonance irradiation for saturating the solid pool, then there is no conceptual difference between Eq. 1 and 2. In this case, the magnetization of the observed free water pool either decays or recovers in presence of the off-resonance irradiation to the same steady state value, with same relaxation time $T_{1sat}$.

The fitting routines can be developed with Matlab (The Mathworks, Inc). Robustness of the parametric maps can be evaluated by estimating the coefficient of variations of $T_{1sat}$ and $M_{ss}/M_0$ in regions of interest (ROIs) placed in the white matter (WM) and grey matter (GM) within the same subject, along with the mean and standard deviations among different subjects. More particularly, robustness of the maps can be compared based on: a) fitting Eq. (1) only to the data acquired from the positive hemisphere; b) fitting Eq. (2) only to the data acquired from the negative hemisphere; or c) fitting Eq. (1) and Eq. (2) simultaneously to the data acquired from both positive and negative hemispheres (as disclosed herein).

Results and Discussion

Figure 3:
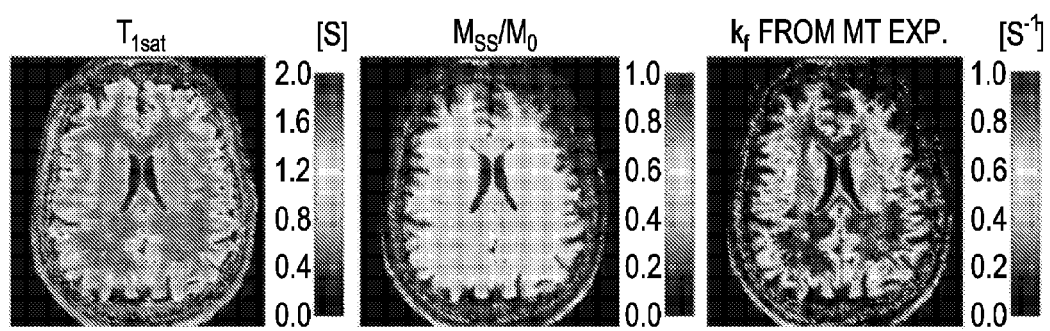
FIG. 3 illustrates selected results according to one example.

The images shown in FIG. 3 depict results from a representative subject (SD within subjects were ~10%).

FIG. 3 illustrates an example of an MT method. The MT method exhibits tissue specificity in terms of gray vs. white matter separation.

As shown in FIG. 2C, the SI of the water tends to approach a SS value ($M_{ss}$) in the presence of off-resonance CW irradiation. The time constant which characterizes how fast the SS is reached (i.e., $T_{1sat}$), along with the value of the SS itself, does not appear to depend on the initial orientation of magnetization (M), i.e. whether M is initially aligned along +z or −z (FIG. 2C). Under the experimental conditions described herein, the presence of the on-resonance inversion pulse can be neglected as compared to the subsequent CW irradiation in terms of saturating the solid pool. Bloch simulations, can be used to demonstrate that the magnetization of spins with $T_2$~10 μs and $T_1$=1 s (general assumptions for macromolecular relaxation parameters) is already zero at the end of the inversion pulse described here. This means that the duration of the inversion pulse should be added to the total duration of the saturation time of the solid pool in Eq. 2. On the other hand, a CW irradiation with $\omega_1^{max}/(2\pi)$=0.15 kHz needs to be longer than only ~15 ms to completely saturate the macromolecular spins. Since the minimum CW irradiation time described here (300 ms) is much longer than 15 ms, and is also much longer than the duration of the inversion pulse (6 ms), the complete saturation of the macromolecular pool will be achieved, while the presence of the initial on-resonance inversion can be neglected in subsequent calculations. The fitting results also indicate that Eqs. 1 and 2, which utilize mono-exponential rather than multi-exponential functions, are a reasonable representation of the observed SI time evolution. Overall, the same $T_{1sat}$ satisfactorily describes both the decay and recovery to the same steady state value of magnetization, while the resulting fitted curves fairly describe the time-course of the SI at the considered saturation times.

Extracting $T_{1sat}$ and $M_{ss}$ from experimental data implies the solution of 3-parameter fitting based on Eq. (1) and/or Eq. (2). Due to SAR limitations in humans, the most problematic parameter to fit is $M_{ss}$, as impractical CW irradiations on the order of a few seconds are in principle required to reliably determine the value of $M_{ss}$. In addition, the presence of a SS value different from the noise level has a detrimental effect on $T_{1sat}$ fitting, since it reduces the dynamic range of the SI decay. As a result of these limitations, when sampling SI with a standard MT acquisition with incremental CW irradiation up to 1.2 s, both $T_{1sat}$ and $M_{ss}/M_0$ parametric maps are of poor quality and are characterized by the presence of many "holes". The quality of the parametric maps improves when fitting the data with the inversion pulse prior to the CW irradiation. This improvement occurs despite the fact that the number of data points may be unchanged relative to a standard MT acquisition. The reason for this improvement is the ~3-fold increase of the dynamic range of the SI variations. Indeed, whereas in the previous case magnetization decays from $M_0$ to $M_{ss}$=~0.5 $M_0$ (i.e. 50% dynamic range), in the present case $M_0$ recovers from $-M_0$ to Mss=~0.5 $M_0$ (i.e., 150% dynamic range), thus largely facilitating the fitting of $T_{1sat}$ and $M_{ss}$. The choice of using the complete data set acquired from both positive and negative hemispheres can further improve the reliability of the fitting of $T_{1sat}$ and $M_{ss}/M_0$, resulting in parametric maps with increased tissue specificity as compared to MT acquisition performed from the positive hemisphere only. A portion of this improvement originates from doubling the number of data points. Accordingly, the coefficient of variations of $T_{1sat}$ and $M_{ss}/M_0$ calculated from regions of WM and GM are several folds smaller when global inversion is applied prior to the CW irradiation. The standard deviations of the parameters within different subjects substantially decreases as well, thus leading to a possibility of increased statistical power for those studies which are designed to compare different conditions and/or populations of subjects.

The MTR maps obtained with or without the initial inversion pulse are both affected by the same $T_{1sat}$s, but the inversion-recovery-like-acquisition enhances the $T_{1sat}$ weighting, which results in increased WM/GM contrast.

When the magnetization exchange rate is calculated as $k_f$=(1−$M_{ss}/M_0$)/$T_{1sat}$, the obtained values are in the range of 1 s$^{-1}$. In this context, the quantitative estimate of $k_f$ can be viewed as an average magnetization exchange rate, rather than in terms of an accurate estimate of the forward exchange rate from one specific pool of protons to another.

In order to further increase the reliability of the parametric mapping, other independent acquisitions can, in principle, be performed with any initial orientation of the magnetization. However, the acquisition time may increase. As such, the details of the acquisition protocol can be fine-tuned to the time limitations of the specific study of interest. Good parametric maps can be obtained with a full data set of images acquired consecutively from the positive and negative hemisphere, however, reasonable compromises can be reached using subsets of data (for instance, the data from the negative hemisphere only).

An example here is described using CW off-resonance irradiation. However, other trains of saturation pulses can be equally employed. Also, sampling the SS formation from the negative hemisphere may provide similar benefits to experiments based on chemical exchange saturation transfer (CEST), as these methodologies are similar to the MT approach.

In one example, the formation of the SS in MT experiments in vivo can be sampled by changing the initial orientation of magnetization, rather than increasing the duration of the off-resonance irradiation, and thus can circumvent SAR limitations.

Part 3

An example of the present subject matter can include a method. The method can be configured to provide an image, a ratio, or quantification of a selected parameter. For example, a method can be configured to investigate presence of demyelination.

Figure 4:
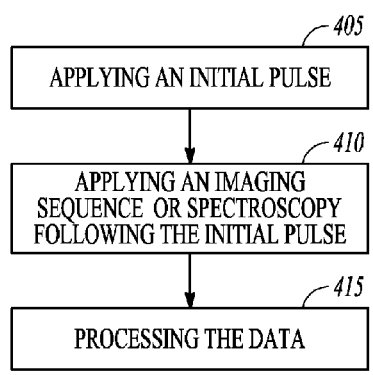
FIG. 4 includes a flow chart of a method for magnetization transfer according to one example.

FIG. 4 illustrates a flow chart for a method corresponding to one example. In the example, the method includes, at 405, applying an initial pulse to a region of interest. The region of interest can include brain or other tissue of a human subject.

The method also includes, at 410, applying an imaging sequence (or spectroscopy) following the initial pulse. The imaging sequence (or spectroscopy) can include an off-resonance irradiation in which the frequency is shifted from the center frequency by 1 kHz, 1.5 kHz, 6 kHz, or other offset.

The method also includes, at 415, processing the data to generate an image or spectra corresponding to the region of interest. This can include generating an MT ratio or generating a parametric map of $T_{1sat}$, $M_{ss}$, or $k_f$.

ADDITIONAL NOTES

Magnetic transfer can be evaluated using qualitative ratio maps calculated as a ratio between two acquisitions: one without MT pulse, and one with MT pulse. The acquisition time is generally rather short (typically, using two acquisitions). Such maps do not provide quantitative information about the tissue.

Quantitative parameters of relaxation as $T_{1sat}$ and a ratio of magnetization $M_{SS}/M_0$ (parametric maps) can be estimated by fitting data acquired in correspondence of different duration of the MT pulse.

An example of the present subject matter, on the other hand, includes performing data acquisition from −z rather than +z axis alone, by placing an initial pulse (such as an inversion pulse) before the MT pulse. The quality of the parametric maps of $T_{1sat}$ and $M_{SS}$ are generally improved and especially so with full data acquisition from +z and −z.

An example of the present subject matter also shows improvement in a parametric map of $k_f$ calculated based on $T_{1sat}$ and $M_{SS}$ values.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A magnetic resonance system comprising:
   a driver unit configured to apply a perturbation to a spin system; and
   a processor coupled to the driver unit, the processor programmed to generate an initial pulse followed by a data acquisition train, wherein the data acquisition train provides data based on magnetization transfer or off-resonance irradiation, and
   wherein the processor is programmed to generate an image or spectra corresponding to the spin system in which magnetization is initially aligned with a positive z-axis of the spin system and programmed to generate an image or spectra corresponding to the spin system in which magnetization is initially aligned with a negative z-axis of the spin system.

2. The system of claim 1 wherein the driver unit is configured to apply the initial pulse, and the initial pulse is configured to rotate magnetization to a preset angle.

3. The system of claim 1 wherein the processor is programmed to cause the driver unit to apply off-resonance irradiation.

4. The system of claim 1 wherein the processor is programmed to cause the driver unit to apply the data acquisition train.

5. The system of claim 1 wherein the processor is programmed to generate a ratio corresponding to magnetization transfer.

6. A magnetic resonance method comprising:
   programming a processor to perform as follows:
   applying an imaging sequence or spectroscopy sequence when initial magnetization of a spin system is aligned with a positive z-axis, the sequence configured to provide data based on an off-resonance preparation;
   applying an initial, on-resonance pulse to the spin system, the initial pulse configured to rotate magnetization to a negative z-axis of the spin system;
   applying an imaging sequence or spectroscopy sequence following the initial pulse, the sequence configured to provide data based on an off-resonance preparation; and
   processing the data to generate an image or spectra corresponding to the region of interest.

7. The method of claim 6 wherein applying the imaging sequence includes applying a sequence configured for at least one of magnetization transfer (MT), chemical exchange saturation transfer (CEST), spin-lock $T_{1\rho}$ (SL-$T_{1\rho}$), or relaxation along a fictitious field (RAFF).

8. The method of claim 6 wherein applying the initial pulse includes applying a radio frequency pulse which aligns magnetization substantially on the negative z-axis.

9. The method of claim 6 wherein applying the initial pulse includes applying a pulse prior to imaging readout or spectroscopic localization.

10. The method of claim 6 wherein applying the imaging sequence or spectroscopy sequence includes applying an off-resonance continuous wave or pulsed irradiation.

11. The method of claim 6 wherein applying the imaging sequence or spectroscopy sequence includes applying a pulse train configured to induce formation of a steady state of magnetization.

12. The method of claim 6 further including generating a ratio corresponding to magnetization transfer.

13. The method of claim 6 wherein processing the data includes quantifying an intrinsic relaxation parameter.

* * * * *